United States Patent [19]
Huang et al.

[11] Patent Number: 6,037,199
[45] Date of Patent: Mar. 14, 2000

[54] SOI DEVICE FOR DRAM CELLS BEYOND GIGABIT GENERATION AND METHOD FOR MAKING THE SAME

[75] Inventors: Jenn-Ming Huang; Jin Yuan Lee, both of Hsin-Chu, Taiwan

[73] Assignee: Taiwan Semiconductor Manufacturing Company, Ltd., Hsin-Chu, Taiwan

[21] Appl. No.: 09/374,296

[22] Filed: Aug. 16, 1999

[51] Int. Cl.$^7$ .............................. H01L 21/00; H01L 21/84
[52] U.S. Cl. .................... 438/166; 438/151; 438/155; 438/171; 438/149; 257/347; 257/300; 257/353; 257/355
[58] Field of Search ...................................... 438/155, 164, 438/166, 167, 171, 149, 151, 152; 117/10, 8–9, 43–45; 257/300, 305, 330, 66, 68

[56] References Cited

U.S. PATENT DOCUMENTS

| | | | |
|---|---|---|---|
| 4,749,441 | 6/1988 | Christenson et al. | 156/644 |
| 4,829,016 | 5/1989 | Neudeck | 437/31 |
| 4,897,366 | 1/1990 | Smeltzer | 438/412 |
| 5,037,774 | 8/1991 | Yamawaki et al. | 117/8 |
| 5,445,107 | 8/1995 | Roth et al. | 438/481 |
| 5,610,087 | 3/1997 | Hsu et al. | 437/32 |
| 5,686,343 | 11/1997 | Lee | 437/62 |
| 5,708,286 | 1/1998 | Uesugi et al. | 257/330 |
| 5,712,173 | 1/1998 | Liu et al. | 437/24 |

*Primary Examiner*—Charles Bowers
*Assistant Examiner*—Craig Thompson
*Attorney, Agent, or Firm*—George O. Saile; Stephen B. Ackerman

[57] ABSTRACT

A process enabling high density, DRAM semiconductor chips to be achieved, via formation of DRAM cells, in SOI segments, has been developed. The process features the formation of an SOI layer, propagating from a central node region of a semiconductor substrate, exposed in an opening in an insulator layer, and with the SOI layer extending, and overlying, a portion of the insulator layer, at a distance between about 4 to 5 um, from the central node region. Individual SOI segments are then formed via trimming of the SOI layer, via oxidation of unwanted regions of the SOI layer, followed by removal of these oxidized regions. The DRAM cell, at an area between about 0.28 to 0.32 um$^2$ is next formed in the individual SOI segments.

21 Claims, 6 Drawing Sheets

SOI DEVICE FOR DRAM CELLS BEYOND GIGABIT GENERATION AND METHOD FOR MAKING THE SAME

BACKGROUND OF THE INVENTION (1) Field of the Invention

The present invention relates to methods used to fabricate semiconductor devices, and more specifically to a method use to fabricate dynamic random access memory, (DRAM), cells, on silicon on insulator, (SOI).

(2) Description of Prior Art

Major objectives of the semiconductor industry have been to increase device performance, while still increasing device density. The use of silicon on insulator, (SOI), layers, have allowed these objectives to be successfully addressed. Performance degrading, junction capacitances, have been minimized, when placing active device regions, such as source/drain regions, in an SOI layer. In addition the use of forming devices, such as a DRAM device, in a SOI layer, allows fully isolated transistors, and cells, to be formed without the use of area consuming, conventional isolation structures, such as insulator filled shallow trench region, or field oxide regions, thus allowing DRAM semiconductor chips, with densities greater than a gigabit bit, to be achieved. However the attainment of high quality SOI layers, to accommodate the high performance devices, can be difficult to achieve.

Prior art, such as Hsu et al, in U.S. Pat. No. 5,610,087, describe the formation of both lateral, bipolar junction devices, as well as metal oxide semiconductor field effect transistors, (MOSFET), in an SOI layer. However that prior art forms the critical SOI layer via a SIMOX, (Separation by Implanted Oxygen), process, which results in a blanket SOI layer, at a thickness between about 1000 to 2000 Angstroms, and presenting a defect density of less than about 1E4 defects /cm$^2$. This invention will present a novel approach for the attainment of the SOI layer, and the trimming the SOI layer, to create segments of SOI layers, used only to accomodate the active device regions, thus allowing improved device density to be accomplished. A major feature of this invention is the initiation of the single crystalline silicon layer, (SOI layer), via deposition of an amorphous, or polysilicon layer, followed by an anneal cycle, resulting in the initiation of the of the SOI layer in a central node region of the semiconductor substrate, a region exposed in an opening in an insulator layer. The formation of the SOI layer is then continued by the extension of this layer, upwards from the opening in the insulator layer, and extending laterally, overlying a specific portion of the underlying insulator layer, terminating at a specific distance from the opening, or central node region, from which the SOI layer initiated. Trimming of the SOI layer, via oxidation of unwanted regions of the SOI layer, results in the formation of individual SOI segments, used to accomodate the submicron DRAM devices, used for the gigabit or greater, DRAM chips.

SUMMARY OF THE INVENTION

It is an objective of this invention fabricate DRAM devices, and high density DRAM cells, in segments of an SOI layer.

It is another objective of this invention to form a single crystalline silicon layer, on an underlying insulator layer, (SOI), via deposition of an amorphous silicon layer followed by an anneal cycle, forming the SOI layer, propagating from an area, or a cental node region, of the semiconductor substrate, exposed in an opening in an insulator layer, and extending laterally from the central node region, to regions overlying the top surface of the underlying insulator layer, in a region adjacent to the central node region.

It is still yet another objective of this invention to isolate segments of the SOI layer, via oxidation of unwanted regions of the SOI layer, and to form the DRAM devices, in the SOI segments.

In accordance with the present invention a method of fabricating high density, DRAM cells, in SOI segments, is described. Openings are made in an insulator layer, exposing regions of a semiconductor substrate. Formation of a single crystalline silicon layer, or an SOI layer, is next accomplished, via deposition of an amorphous silicon layer, followed by an anneal procedure, converting the amorphous silicon to the SOI layer, in a region propagating from the exposed, or central node region, of the semiconductor substrate, and extending laterally overlying a portion of the insulator layer, with the SOI layer terminating, in the form of polysilicon, at a specific distance from the central node region. A composite insulator shape, comprised with an overlying silicon nitride layer, is then used as a mask to allow oxidation of specific regions of the SOI layer to be accomplished, followed by the removal of the thermally grown silicon oxide region, resulting in isolation of, or in the creation of, specific, unoxidized, SOI segments. After formation of the well regions, and threshold adjust regions, in the specific SOI segments, the transfer gate transistors, for the DRAM devices, are formed, comprising: the growth of a gate insulator layer, on the top surface of the SOI segments; the formation of gate structures, source/drain regions; and insulator spacers, on the sides of the gate structures; and the formation of bit line, and capacitor structures.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
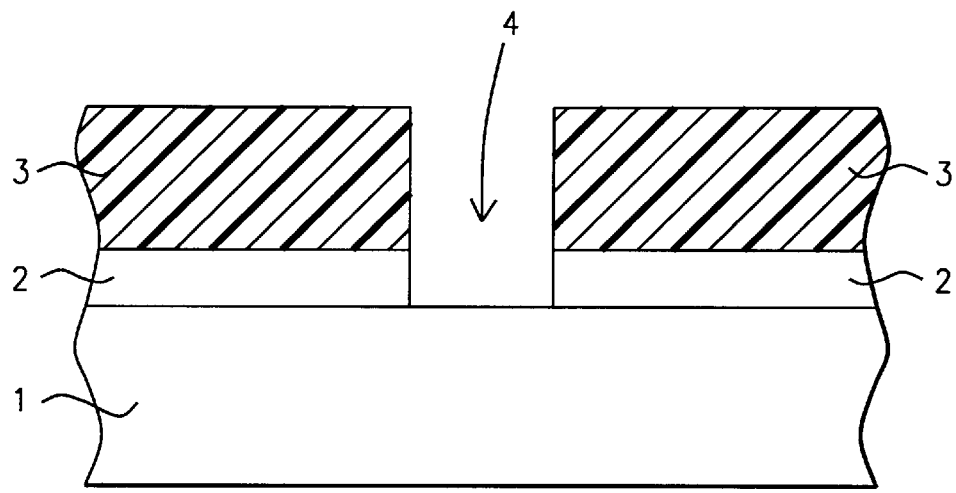
FIGS. 1–9, which schematically, in cross-sectional style, describe the key stages of fabrication, used to create high density, DRAM cells, in SOI segments.

The method of fabricating DRAM devices, in SOI segments, will now be described in detail. A P type, semiconductor substrate 1, comprised of single crystalline silicon, with a <100> crystallographic orientation is used and schematically shown in FIG. 1. Insulator layer 2, comprised of silicon oxide, is next formed at a thickness between about 500 to 1000 Angstroms, via thermal oxidation procedures, or via a low pressure chemical vapor deposition, (LPCVD), or plasma enhanced chemical vapor deposition, (PECVD), procedure. Photoresist shape 3, is then used as a mask to allow opening 4, to be formed in insulator 2, via a wet etch procedure, using a buffered hydrofluoric acid solution, or via a selective, reactive ion etching, (RIE), procedure, using CHF$_3$ as an etchant. Opening 4, with an area of about 0.04 um$^2$, shown schematically in FIG. 1, comprised with dimensions of between about 0.18 to 0.22 um, by between about 0.18 to 0.22 um, will be referred to as the central node region, or the region in which the silicon on insulator, (SOI), layer, will propagate from. After the formation of central node region 4, photoresist shape 3, is removed via plasma oxygen ashing and careful wet cleans.

Figure 2:
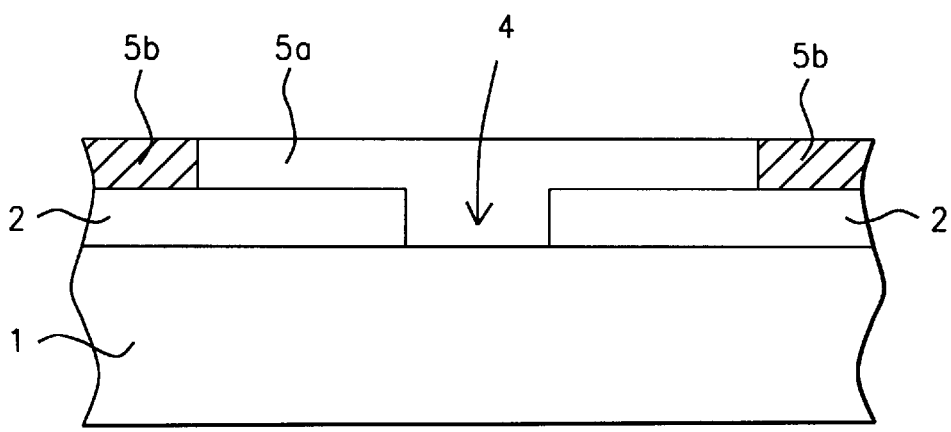

FIG. 2, schematically shows the formation of SOI layer 5a, propagating from central node region 4, and extending over a portion of insulator layer 2. The formation of SOI layer 5a, initiates with the deposition of an amorphous silicon, or polysilicon layer, at a temperature between about 450 to 580° C., to a thickness between about 300 to 1000 Angstroms. An anneal procedure is next performed at a temperature between about 550 to 600° C., in a nitrogen ambient, for a time between about 1 to 24 hrs., to convert regions of the amorphous silicon layer to SOI layer 5a. The conversion to SOI layer 5a, initiates at the interface of the amorphous silicon and single crystalline, semiconductor substrate 1, in central node region 4, and propagates, and extends, to overlay the portions of insulator layer 2, closest to central node region 4. At the conclusion of the anneal cycle, regions of the amorphous silicon layer, furthest from central node region 4, remain amorphous or polysilicon, and are shown as polysilicon regions 5b, in FIG. 2. With an opening for central node region of about 0.04 um$^2$, and using the above anneal conditions, the single crystalline SOI layer 5a, can extend about 0.4 to 0.5 um, from central node region 4, allowing a subsequent DRAM cell, of about 0.3 um$^2$ to be accommodated in a SOI segment.

Figure 3:
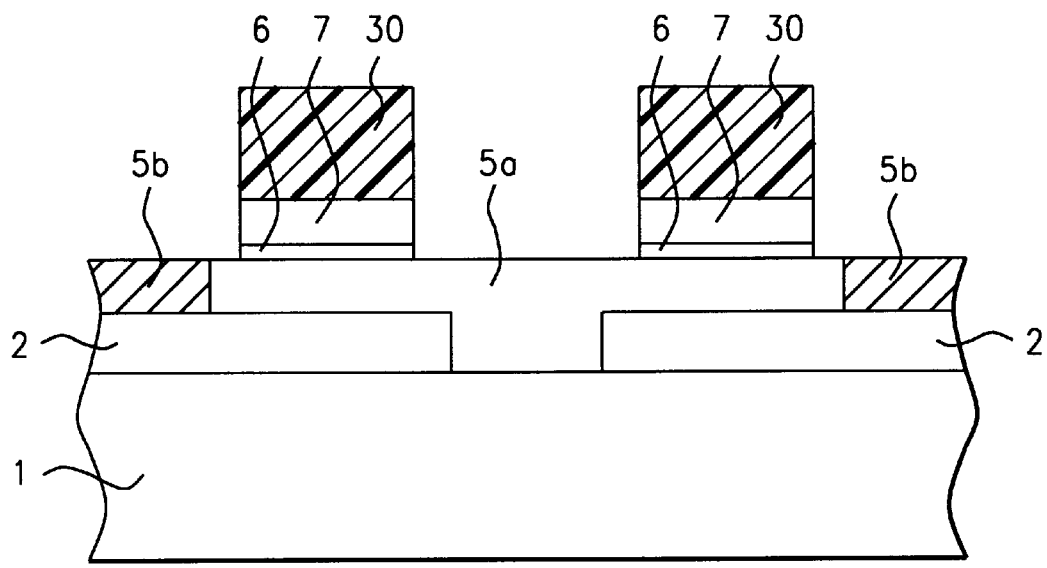
Figure 4:
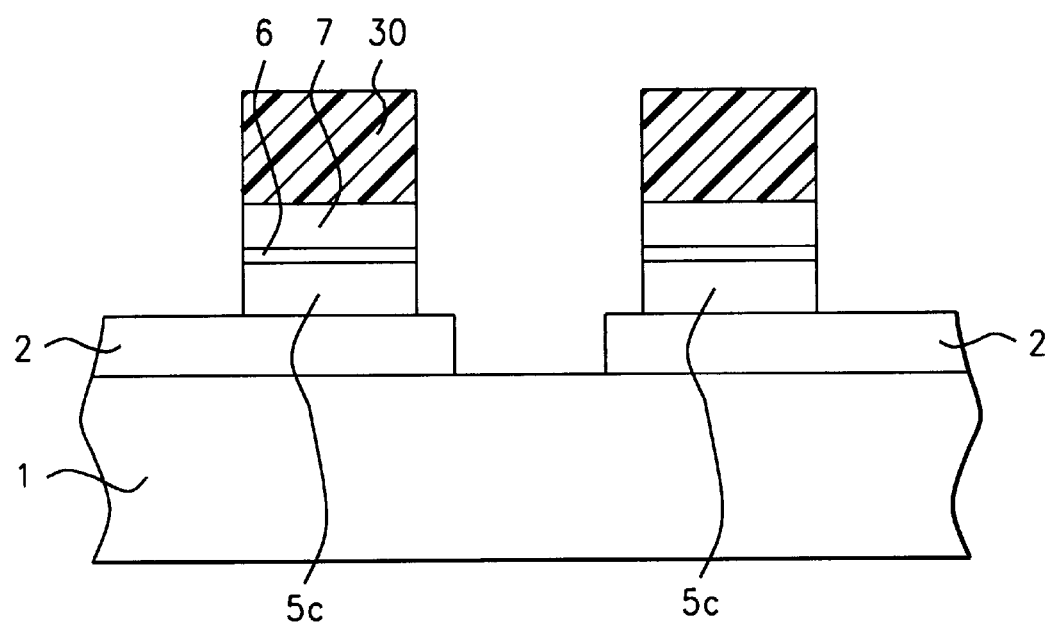
Figure 5:
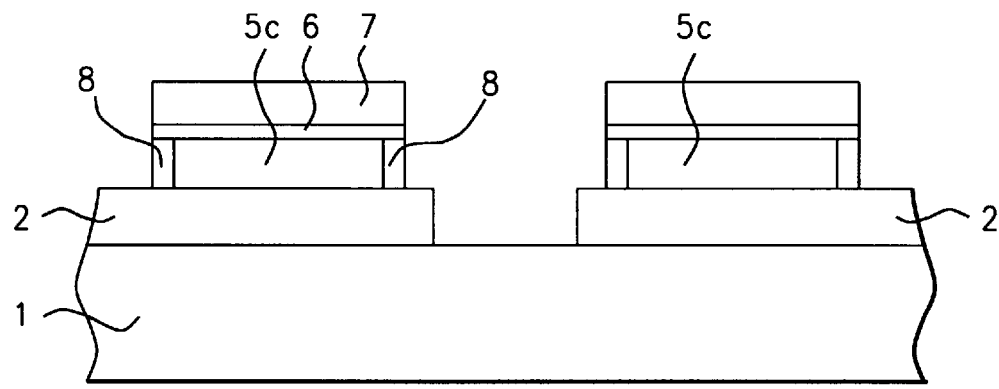
Figure 6:
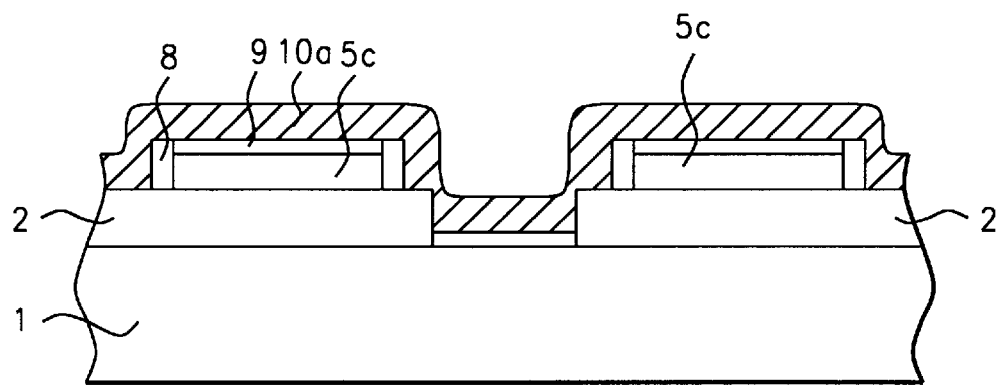

The trimming of SOI layer 5a, into SOI segments, each to be used for a specific DRAM cell, is next addressed and schematically shown in FIGS. 3–5. A composite insulator shape, comprised of silicon nitride layer 7, and silicon oxide layer 6, to be used as an oxidation resistant mask, is next formed and schematically shown in FIG. 3. First a silicon oxide layer 6, is thermally grown, of obtained via LPCVD or PECVD procedures, at a thickness between about 50 to 200 Angstroms, followed by the deposition of silicon nitride layer 7, via LPCVD or PECVD procedures, at a thickness between about 1000 to 2000 Angstroms. Conventional photolithographic and RIE procedures, using photoresist shape 30, as a mask, and using $CHF_3$ as an etchant for silicon nitride layer 7, and silicon oxide layer 6, are used to define the composite insulator shape, shown schematically in FIG. 3. Another anisotropic RIE procedure, is then performed, using $Cl_2$ as an etchant, selectively removing exposed regions of SOI layer 5a, resulting in the creation of individual SOI segment 5c. This is schematically shown in FIG. 4. After removal of photoresist shape 30, via plasma oxygen ashing and careful wet cleans, a post etching anneal procedure is performed in an oxygen containing ambient, resulting in the formation of silicon oxide spacers 8, located on the sides of SOI segments 5c. This is schematically shown in FIG. 5. The composite insulator shape is then removed, The formation of the DRAM cells, in SOI segments 5c, is next addressed. For this invention the DRAM devices will be N channel devices, and therefore P well regions, are formed in SOI segments 5c. However if P channel, DRAM devices are desired, N well regions would be formed in SOI segments 5c. The P well region, not shown in the drawings, is established via an ion implantation procedure, using boron, or $BF_2$ ions, at an energy between about 40 to 100 KeV, at a dose between about 1E12 to 1E14 atoms/cm$^2$. A threshold adjust region, again not shown in the drawings, in then formed near the top surface of SOI segments 5c, via an ion implantation procedure, performed using boron, or $BF_2$ ions, at an energy between about 10 to 40 KeV, at a dose between about 1E12 to 1E14 atoms/cm$^2$. A thermal oxidation procedure is next performed in an oxygen—steam ambient, at a temperature between about 800 to 1100° C., creating silicon dioxide, gate insulator layer 9, located on the top surface of SOI segments 5c, at a thickness between about 30 to 100 Angstroms. Polysilicon layer 10a, is then deposited, via LPCVD procedures, to a thickness between about 1000 to 2000 Angstroms. Polysilicon layer 10a, is either doped in situ, during deposition, via the addition of arsine, or phosphine, to a silane ambient, or polysilicon layer 10a, is deposited intrinsically, then doped via an ion implantation procedure, using arsenic, or phosphorous ions. The result of these procedures is schematically shown in FIG. 6.

Figure 7:
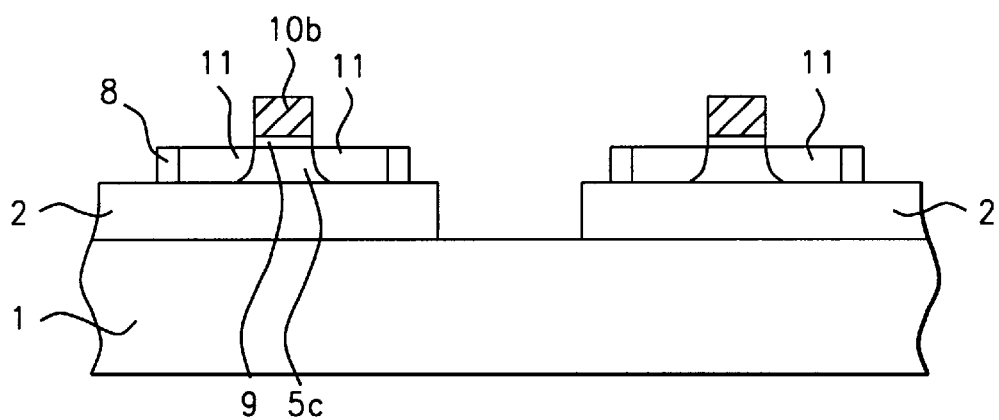

Conventional photolithographic and RIE procedures, using $Cl_2$ as an etchant, are used to pattern polysilicon layer 10a, creating polysilicon gate structures 10b, schematically shown in FIG. 7. Lightly doped, N type, source/drain regions 11, are next formed in regions of SOI layer, not protected by the photoresist shape, used for definition of polysilicon gate structures 11, via an ion implantation procedure, using arsenic, or phosphorous ions, at an energy between about 20 to 50 KeV, at a dose between about 1E15 to 5E15 atoms/cm$^2$. This is schematically shown in FIG. 7. The source/drain regions, consuming the entire thickness of SOI segment 5c, do not result in the performance degrading junction capacitances, encountered with conventional, or non-SOI devices, since these regions are butted to underlying insulator layer 2. Again as previously mentioned, if P channel DRAM devices were desired, the source/drain regions would be fabricated as P type, lightly doped source/drain regions. The removal of the photoresist shape, used for definition of polysilicon gate structures 10b, via plasma oxygen ashing and careful wet cleans, also results in the removal of the regions of silicon dioxide gate insulator layer 9, not covered by polysilicon gate structures 10b.

Figure 8:
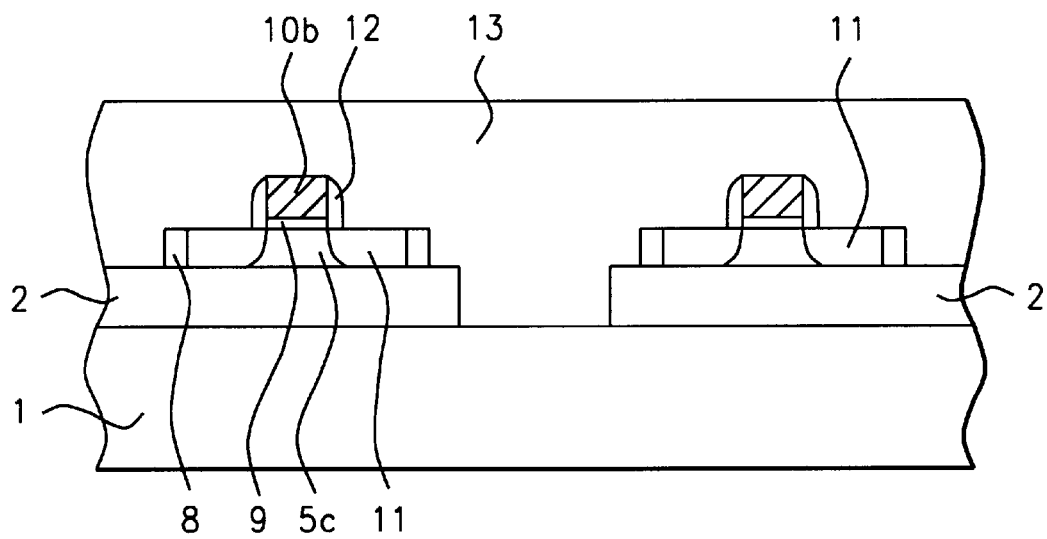
Figure 9:
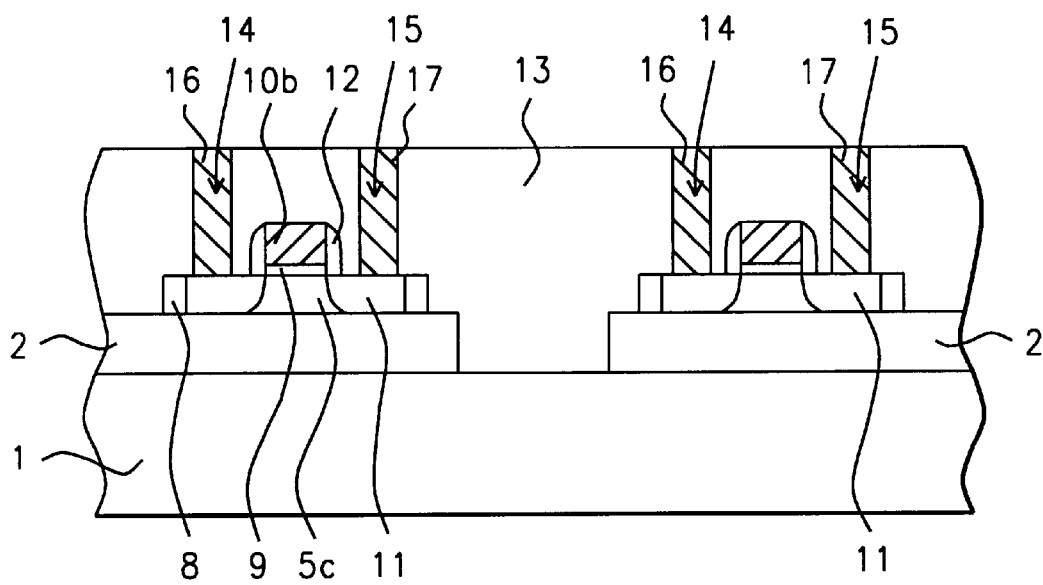

Insulator spacers 12, comprised of either silicon oxide or silicon nitride, are next formed on the sides of polysilicon gate structures 10b, via the deposition of either silicon oxide, or silicon nitride, via LPCVD or PECVD procedures, at a thickness between about 500 to 1500 Angstroms, followed by an anisotropic RIE procedure, using $CHF_3$ or $Cl_2$ as an etchant. An insulator layer 13, comprised of either silicon oxide, or borophosphosilicate glass, (BPSG), is then deposited via LPCVD or PECVD procedures, to a thickness between about 5000 to 8000 Angstroms, followed by a chemical mechanical polishing procedure, used to planarize the top surface of insulator layer 13. This is schematically shown in FIG. 8. Conventional photolithographic and anisotropic RIE procedures, using $CHF_3$ as an etchant, are used to create capacitor opening 14, and bit line opening 15, in insulator layer 13, exposing portions of the top surface of lightly doped, N type, source/drain regions, 11. A conductive material, such as tungsten, or doped polysilicon, is next deposited, via LPCVD procedures, at a thickness between about 2000 to 3000 Angstroms, completely filling capacitor opening 14, and bit line opening 15. Removal of the conductive material, from the top surface of insulator layer 13, via either a chemical mechanical polishing procedure, or via a selective RIE procedure, using $Cl_2$ as an etchant, results in capacitor storage node plug 16, in capacitor opening 14, and results in bit line contact structure 17, in bit line opening 15. This is schematically shown in FIG. 9. Subsequent formation of a capacitor structure, (not shown in the drawings), overlying, and contacting, capacitor storage node plug 16, and formation of a bit line structure, (not shown in the drawings), overlying, and contacting, bit line contact structure 17, complete the process used to create DRAM cells, with a cell area between about 0.28 to 0.32 um$^2$, in SOI segments, allowing high density DRAM chips to be realized.

Figure 10:
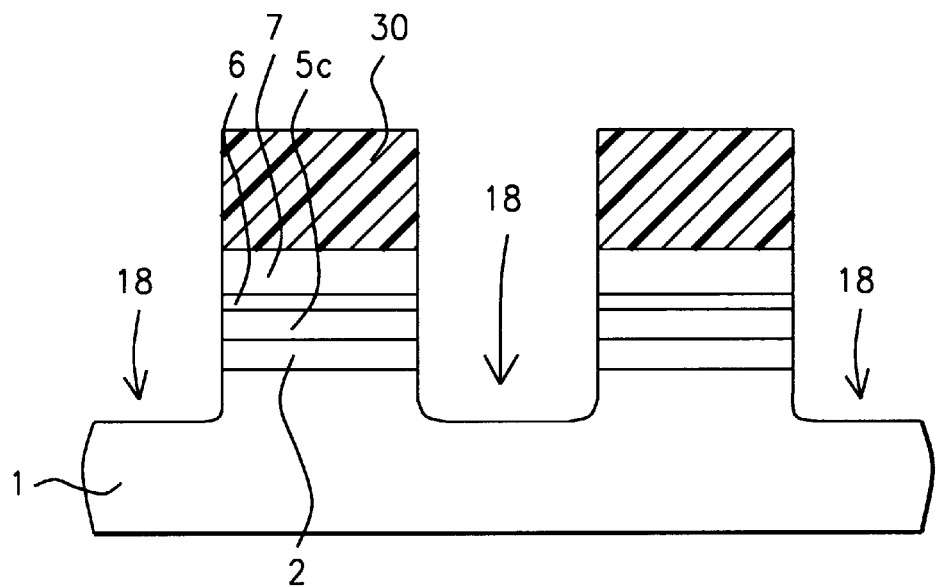
FIGS. 10–11, which schematically, in cross-sectional style, describes the fabrication sequence used to isolate SOI segments, via the use of permanent silicon oxide regions.
Figure 11:
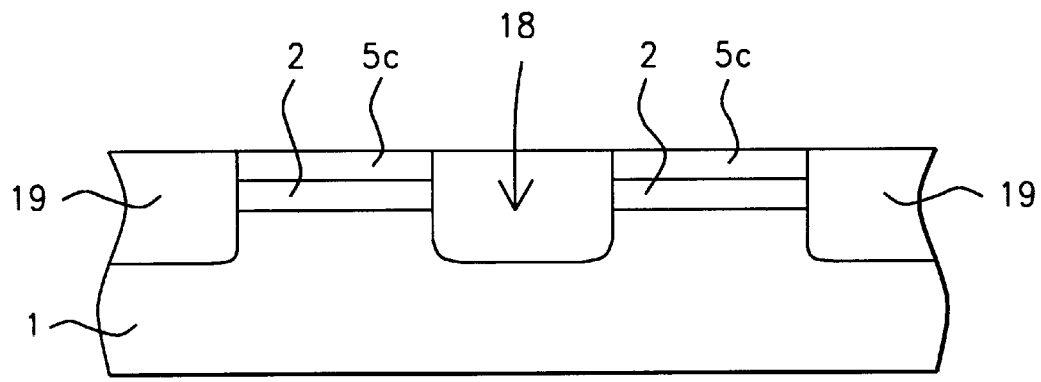

A second approach used to isolate, or to form individual SOI segments will now be described, and shown schematically in FIGS. 10–11. Referring back to FIG. 3, composite insulator shape, comprised of silicon nitride layer 7, and silicon oxide layer 6, as well as photoresist shape 30, are shown overlying the regions of SOI layer 5a. An anisotropic RIE procedure, using $Cl_2$ as an etchant, is used to create trenches 18, via removal of exposed material. This is schematically shown in FIG. 10. After removal of photoresist shape 30, via plasma oxygen ashing and careful wet cleans, trenches 18, are completely filled with silicon oxide layer 19, via high density plasma deposition. Planarization of the silicon oxide filled trenches, via chemical mechanical polishing, and removal of the insulator shape, result in the isolation needed between individual SOI segments. This is schematically shown in FIG. 11. DRAM cells are then formed in SOI segments 5c, using the identical processing sequences used for the first, or previous approach.

Figure 12:
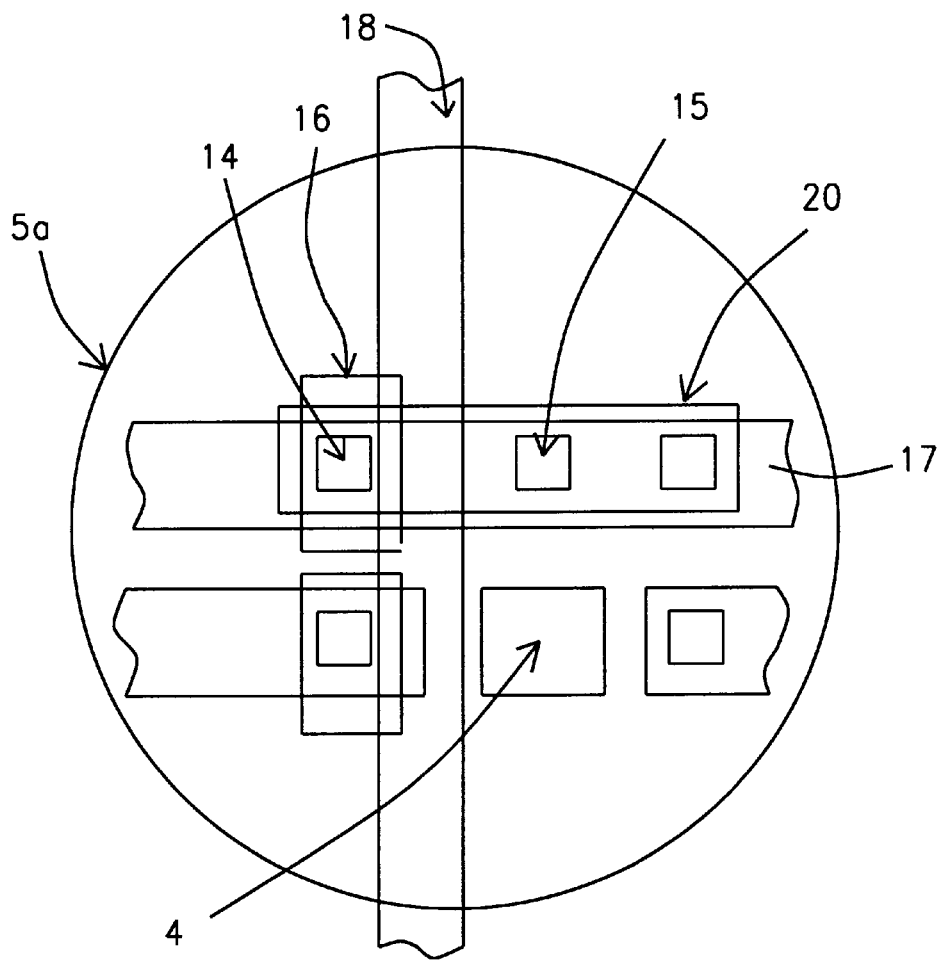

A top view, showing the novel layout of a DRAM cell, contained in an SOI segment, is schematically shown in FIG. 12. Opening 4, or central node 4, used to allow the propagation of single crystalline silicon, is shown, exhibiting an area of 0.04 $um^2$, comprised with each side being about 0.2 um. The concentric growth of single crystalline layer 5a, is shown extending between about 0.4 to 0.5 um, from central node 4. The active device region 20, for the DRAM cell, of about 0.3 $um^2$, is comprised with active device region having dimensions of about 0.2 um by about 1.5 um. Also shown in FIG. 12, are bit line opening 15, capacitor opening 14, capacitor plate 16, bit line 17, and word line 18.

While this invention has been particularly shown and described with reference to the preferred embodiments thereof, it will be understood by those skilled in the art that various changes in form and detail may be made without departing from the spirit and scope of this invention.

What is claimed is:

1. A method of fabricating a dynamic random access memory, (DRAM), cell, in a silicon on insulator, (SOI), layer, on a semiconductor substrate, comprising the steps of:

forming an opening in a first insulator layer, exposing a region of said semiconductor substrate;

depositing an amorphous silicon layer;

performing an anneal procedure to convert said amorphous silicon layer, to said SOI layer, with said SOI layer formation initiating in said opening, in said first insulator layer, and with said SOI layer extending from said opening, to overlay a first portion of said first insulator layer, while unconverted amorphous silicon, still remains on a second portion of said first insulator layer;

patterning of said SOI layer, via a reactive ion etch procedure, removing portions of said SOI layer, resulting in unetched, SOI segments;

performing a post etch anneal, creating insulator spacers on the sides of said SOI segments;

forming well regions, and threshold adjust regions, in said SOI segments:

forming transfer gate transistors in said SOI segments, with each transfer gate transistor comprised with: a gate insulator layer; a gate structure; source/drain regions, in a region of an SOI segment, not covered by said gate structure; and insulator spacers on the sides of said gate structure;

forming openings in a second insulator layer, exposing source/drain regions; and forming a capacitor structure, overlying said second insulator layer, and contacting a first source/drain region, exposed in a first opening, in said second insulator layer, and forming a bit line structure, overlying said second insulator layer, and contacting a second source/drain region, exposed in a second opening, in said second insulator layer.

2. The method of claim 1, wherein said first insulator layer is a silicon oxide layer, obtained via either thermal oxidation procedures, or via LPCVD or PECVD procedures, at a thickness between about 500 to 1000 Angstroms.

3. The method of claim 1, wherein said opening in said first insulator layer, is formed via a RIE procedure, using $CHF_3$ as an etchant, with said opening in said second insulator layer, comprised with dimensions of between about 0.18 to 0.22 um, by between about 0.18 to 0.22 um.

4. The method of claim 1, wherein said amorphous silicon layer is deposited via LPCVD procedures, at a temperature between about 450 to 580° C., to a thickness between about 300 to 1000 Angstroms.

5. The method of claim 1, wherein said anneal cycle, used to convert said amorphous silicon layer to said SOI layer, is performed at a temperature between about 550 to 600° C., for a time between about 1 to 24 hrs, in a nitrogen ambient.

6. The method of claim 1, wherein the said SOI layer, on said first insulator layer, extends from said opening, in said first insulator layer, between about 0.4 to 0.5 um.

7. The method of claim 1, wherein unwanted portions of said SOI layer are removed via a reactive ion etching procedure, using $Cl_2$ as an etchant.

8. The method of claim 1, wherein said DRAM cell, contained in said SOI segment, is comprised with a cell area between about 0.28 to 0.32 $um^2$.

9. A method of fabricating a DRAM cell, in a segment of an SOI layer, on a semiconductor substrate, wherein said SOI layer is formed via propagation from single crystalline silicon, exposed in an opening in an insulator layer, comprising the steps of:

forming a first insulator layer, on said semiconductor substrate;

forming a first opening, in said first insulator layer, exposing a portion of the top surface of said semiconductor substrate, to be used as a central node region;

deposition of an amorphous silicon layer;

performing an anneal procedure, converting a first portion of said amorphous silicon layer, to said SOI layer, with said SOI layer propagating from central node region, and extending to overlay a first portion of said first insulator layer, located adjacent to said central node region, with a second portion of said amorphous silicon layer, remaining amorphous silicon, or said second portion of said amorphous silicon layer converting to a polysilicon layer;

forming an etch mask shape, overlying a portion of said SOI layer;

performing a reactive ion etching procedure, removing portions of said SOI layer not covered by said etch mask shape, to form SOI segments underlying said etch mask shape;

performing a post etch anneal procedure;

removing said etch mask shape;

creating a well region in a SOI segment;

creating a threshold voltage adjust region, in said SOI segment;

forming a transfer gate transistor, in said SOI segment, comprised of a gate structure, with insulator spacers on the sides of the gate structure, overlying a silicon dioxide gate insulator layer, with lightly doped source/drain regions, in a region of said SOI segment not covered by said gate structure;

forming a planarized insulator layer, overlying said transfer gate transistor;

forming a storage node plug structure, in a first opening in said planarized insulator layer, overlying, and contacting, a first, lightly doped source/drain region, and forming a bit line plug structure, in a second opening in said planarized insulator layer, overlying, and contacting, a second lightly doped source/drain region; and forming a capacitor structure, overlying and contacting said storage node plug structure, and forming a bit line structure, overlying, and contacting, said bit line plug structure.

10. The method of claim 9, wherein said first insulator layer is a silicon oxide layer, obtained via thermal oxidation procedures, or via LPCVD or PECVD procedures, at a thickness between about 500 to 1000 Angstroms.

11. The method of claim 9, wherein said central node region is created via forming an opening in said first insulator layer, via an anisotropic RIE procedure, using $CHF_3$ as an etchant.

12. The method of claim 9, wherein the area of said central node region is between about 0.36 to 0.44 $um^2$.

13. The method of claim 9, wherein said amorphous silicon layer is obtained via LPCVD procedures, at a temperature between about 450 to 580° C., to a thickness between about 300 to 1000 Angstroms.

14. The method of claim 9, wherein said anneal procedure, used to convert said first portion of said amorphous silicon layer, to said SOI layer, is performed at a temperature between about 550 to 600° C., for a time between about 1 to 24 hrs, in a nitrogen ambient.

15. The method of claim 9, wherein said etch maskt shape is comprised of an overlying layer of silicon nitride, at a thickness between about 1000 to 2000 Angstroms, and an underlying silicon oxide layer, at a thickness between about 50 to 150 Angstroms.

16. The method of claim 9, wherein said SOI segment is extends between about 0.4 to 0.5 um, from said central node region, overlying said first insulator layer.

17. The method of claim 9, wherein the area of said DRAM cell, in said SOI segment, is comprised with an area between about 0.28 to 0.32 $um^2$.

18. A DRAM cell, located in an SOI layer, on a semiconductor substrate, comprising:

an opening in a first insulator layer, exposing a portion of said semiconductor substrate;

a single crystalline silicon layer, propagating from said opening in said first silicon layer, and overlaying a portion of said first insulator layer;

an active device region, of said DRAM cell, comprised of a silicon on insulator, (SOI), segment, which in turn is a portion of said single crystalline silicon layer, isolated from other SOI segments by an adjacent, and an overlying, second insulator layer;

insulator spacers on the sides of said SOI segment;

a polysilicon gate structure, on a gate insulator layer, residing on the center of said SOI segment;

source/drain regions, in portions of said SOI segment, not covered by said polysilicon gate structure;

a capacitor opening, in said second insulator layer, exposing a first portion of a source/drain region, and a bit line opening, in said second insulator layer, exposing a second portion of said source/drain region;

a capacitor structure, located in said capacitor opening, and overlying a first portion of the top surface of said second insulator layer; and a bit line structure, located in said bit line opening, and overlying a second portion of said second insulator layer.

19. The DRAM cell of claim 18, wherein the area of said opening in said first insulator layer, is between about 0.36 to 0.44 $um^2$, comprised with dimensions of about 0.2 um by 0.2 um.

20. The DRAM cell of claim 18, wherein said single crystalline silicon layer propagates from said opening in said first insulator layer, and extends concentrically from said opening in said first insulator layer, to between about 0.4 tom 0.5 um, overlying the top surface of said first insulator layer.

21. The DRAM cell of claim 18, wherein the area of said active device region, of said DRAM cell, is between about 0.28 to 0.32 $um^2$.

* * * * *